(12) United States Patent
Briano et al.

(10) Patent No.: US 11,289,406 B2
(45) Date of Patent: Mar. 29, 2022

(54) SIGNAL ISOLATOR HAVING ENHANCED CREEPAGE CHARACTERISTICS

(71) Applicant: Allegro MicroSystems, LLC, Manchester, NH (US)

(72) Inventors: Robert A. Briano, Auburn, NH (US); Shixi Louis Liu, Hooksett, NH (US); William P. Taylor, Amherst, NH (US)

(73) Assignee: Allegro MicroSystems, LLC, Manchester, NH (US)

(*) Notice: Subject to any disclaimer, the term of this patent is extended or adjusted under 35 U.S.C. 154(b) by 96 days.

(21) Appl. No.: 16/574,621

(22) Filed: Sep. 18, 2019

(65) Prior Publication Data

US 2021/0082789 A1    Mar. 18, 2021

(51) Int. Cl.
*H01L 23/495* (2006.01)
*H01L 23/00* (2006.01)

(52) U.S. Cl.
CPC .. *H01L 23/49503* (2013.01); *H01L 23/49575* (2013.01); *H01L 24/06* (2013.01); *H01L 24/48* (2013.01); *H01L 2224/04042* (2013.01); *H01L 2224/06151* (2013.01); *H01L 2224/48177* (2013.01)

(58) Field of Classification Search
CPC ......... H01L 23/49503; H01L 23/49575; H01L 24/06
See application file for complete search history.

(56) References Cited

U.S. PATENT DOCUMENTS

| | | | |
|---|---|---|---|
| 6,995,315 B2 | 2/2006 | Sharma et al. | |
| 7,075,287 B1 | 7/2006 | Mangtani et al. | |
| 7,166,807 B2 | 1/2007 | Gagnon et al. | |
| 7,476,816 B2 | 1/2009 | Doogue et al. | |
| 7,598,601 B2 | 10/2009 | Taylor et al. | |
| 7,709,754 B2 | 5/2010 | Doogue et al. | |
| 8,080,994 B2 | 12/2011 | Taylor et al. | |
| 8,629,539 B2 | 1/2014 | Milano et al. | |
| 8,907,437 B2 | 12/2014 | Milano et al. | |
| 9,190,606 B2 | 11/2015 | Liu et al. | |
| 9,299,915 B2 | 3/2016 | Milano et al. | |
| 9,362,209 B1* | 6/2016 | Mangrum | H01L 23/10 |
| 9,620,705 B2 | 4/2017 | Milano et al. | |
| 9,735,773 B2 | 8/2017 | McIntosh et al. | |
| 9,865,807 B2 | 1/2018 | Liu et al. | |
| 9,958,482 B1 | 5/2018 | Latham | |

(Continued)

FOREIGN PATENT DOCUMENTS

EP   3644069   4/2020

OTHER PUBLICATIONS

Daughton, "Spin-Dependent Sensors;" Proceedings of the IEEE, vol. 91, No. 5; May 2003; 6 Pages.

(Continued)

*Primary Examiner* — Errol V Fernandes

(74) *Attorney, Agent, or Firm* — Daly Crowley Mofford & Durkee, LLP

(57) ABSTRACT

Methods and apparatus for a signal isolator having enhanced creepage characteristics. In embodiments, a signal isolator IC package comprises a leadframe including a die paddle having a first surface to support a die and an exposed second surface. A die is supported by a die paddle wherein a width of the second surface of the die paddle is less than a width of the die.

14 Claims, 15 Drawing Sheets

(56) References Cited

U.S. PATENT DOCUMENTS

| | | |
|---|---|---|
| 10,114,044 B2 | 10/2018 | Geisler et al. |
| 10,247,758 B2 | 4/2019 | Milano et al. |
| 10,333,055 B2 | 6/2019 | Milano et al. |
| 10,345,343 B2 | 7/2019 | Milano et al. |
| 2005/0024908 A1* | 2/2005 | Gizara .................... H02M 3/00 363/147 |
| 2006/0219436 A1 | 10/2006 | Taylor et al. |
| 2006/0255797 A1 | 11/2006 | Taylor et al. |
| 2009/0096072 A1* | 4/2009 | Balakrishnan .... H01L 23/49551 257/670 |
| 2011/0204887 A1 | 8/2011 | Ausserlechner et al. |
| 2014/0151697 A1 | 6/2014 | Ausserlechner et al. |
| 2014/0175528 A1 | 6/2014 | Zieren et al. |
| 2014/0253115 A1 | 9/2014 | Ausserlechner |
| 2020/0185234 A1* | 6/2020 | Ancheta ................ H01L 21/561 |

OTHER PUBLICATIONS

U.S. Appl. No. 16/887,045, filed May 29, 2020, Latham et al.
U.S. Appl. No. 16/884,311, filed May 27, 2020, Liu et al.
Allegro MicroSystems, LLC, "Automotive-Grade, Galvanically Isolated Current Sensor IC with Common-Mode Field Rejection in a Small-Footprint SOIC8 Package;" ACS724 Datasheet, Rev. 15; Jun. 3, 2019; 33 Pages.
Invitation to Pay Additional Fee dated May 25, 2021 for PCT Application No. PCT/US2021/018442; 17 pages.
Search Report and Written Opinion dated Aug. 19, 2021 for PCT Application No. PCT/US2021/018442; 24 pages.

* cited by examiner

SIGNAL ISOLATOR HAVING ENHANCED CREEPAGE CHARACTERISTICS

BACKGROUND

As is known in the art, signal isolators can be used to transfer information across a barrier used to separate voltage domains for safety or functional isolation. For example, optocouplers include a LED that emits light through an optically transparent insulating film and strikes a photo detector that generates a current flow that corresponds to the emitted light. RF carriers can also be used to transmit information across an isolation barrier.

Conventional signal isolators can include an exposed die paddle portion to dissipate heat and to stabilize the package during processing, such as during wirebond attach. In such conventional signal isolators, the exposed area of the die paddle is maximized to maximize heat dissipation generated by circuitry on the die in the IC package. For example, SON packages (a.k.a. DFN Dual Flat Non-lead, QFN Quad Flat No-lead) can be configured with or without an exposed portion of the paddle at the bottom of the package. The die paddle is part of the metal lead-frame to which the integrated circuit die is bonded. The exposed portion of the paddle provides efficient dissipation of heat away from the die and also stabilizes the die during the wirebonding process. To maximize the heat dissipation of the package and to maximize stability during wirebonding the exposed portion of the paddle is made as large as possible.

However, maximizing the exposed die paddle material on an exterior surface of an IC package reduces the creepage distance. Creepage distance refers to the shortest distance separating two conductors as measured along the surface touching both conductors. Reducing creepage distance reduces the voltage level that can be isolated across the barrier.

SUMMARY

Embodiments of the present invention provide methods and apparatus for a signal isolator having enhanced creepage characteristics. In embodiments, a width of an exposed portion of a die paddle of the leadframe in an IC package is reduced as compared with conventional IC packages. By reducing the width of the exposed die paddle portion, creepage distances are increased so as to increase the isolation voltage capability and allow the use of higher voltage differences between first and second voltage domains. In some embodiments, a location of pads on the die are selected to enhance creepage characteristics.

In one aspect, a leadless signal isolator IC package comprises: a leadframe including a die paddle having opposing first and second surfaces, the first surface to support a die and the second surface being exposed on an exterior surface of the IC package; and a die supported by the die paddle, the die having a width, wherein a width of the second surface of the die paddle is less than the width of the die.

A leadless signal isolator IC package can further include one or more of the following features: the die includes pads located within the width of the second surface of the die paddle, isolated domains reside on separate first and second die, the die comprises first and second portions that are electrically isolated from each other, the die includes first and second voltage domains, the die paddle comprises a middle portion having a first thickness and outer portions having a second thickness that is less than the first thickness, the die includes pads located within the width of the second surface of the die paddle, and further including at least one wirebond connected to at least one of the pads, the leadframe includes at least one tie bar exposed on a side of the signal isolator package, a first creepage distance comprises an edge of the at least one tie bar to an edge of an IO of the signal isolator package, and/or the at least one tie bar comprises first and second tie bars.

In another aspect, a leadless signal isolator IC package comprises: a leadframe including a die paddle having opposing first and second sides, the first side comprising a first surface to support a die and the second side including second and third surfaces being exposed on an exterior surface of the IC package; and a die supported by the die paddle, the die having a width.

A leadless signal isolator IC package can include one or more of the following features the second surface overlaps a first edge of the die and the third surface overlaps a second edge of the die, first pads on the die are aligned with the first edge of the die and second pads on the die are aligned with the second edge of the die, the second and third surfaces are substantially rectangular, the first pads and the second pads comprise the only pads on the die, wirebond connections from one of the first pads and from one of the second pads to IO of the leadless signal isolator IC package, and/or the leadframe includes at least one tie bar on a side of the leadless signal isolator IC package.

In another aspect, a leadless signal isolator IC package comprises: a leadframe including a die paddle having opposing first and second sides, the first side comprising a first surface to support a die and the second side including a plurality of exposed surfaces on an exterior surface of the IC package; and a die supported by the die paddle, the die having a width.

A leadless signal isolator IC package can further include one or more of the following features: ones of the plurality of exposed surfaces are aligned with corners of the die, the ones of the plurality of exposed surfaces comprises four exposed surfaces aligned with the corners of the die, pads on the die are aligned with ones of the plurality of exposed surfaces, wirebond connections from the pads on the die to IO of the leadless signal isolator IC package, and/or the ones of the plurality of exposed surfaces are substantially rectangular.

In another aspect, a leadless signal isolator IC package comprises: a leadframe having first and second die paddles each having opposed first and second surfaces; a first die supported by the first surface of the first die paddle; and a second die supported by the first surface of the second die paddle, wherein the second surface of the first die paddle is exposed on exterior surface of the package, and wherein the second surface of the second die paddle is exposed on the exterior surface of the package.

A leadless signal isolator IC package can further include one or more of the following features: the second surface of the first die paddle is aligned with the first die, a width of the second surface of the first die paddle is less than a width of the first die, the second surface of the second die paddle is aligned with the second die, a width of the second surface of the second die paddle is less than a width of the second die, the first and second die are formed from a single die, and/or the first and second die are electrically isolated from each other.

In another aspect, a chip-on-lead signal isolator IC package comprises: a die; a first lead having a first portion having a first thickness and a second portion having a second thickness that is greater than the first thickness, wherein the first portion of the lead supports the die and the second portion of the lead provides an IO connection for the IC package; and a wirebond connection from a pad on the die to the first lead. A chip-on-lead signal isolator IC package can further include the first lead etched to provide the first and second thicknesses.

In another aspect, a flip-chip signal isolator IC package comprises: a die; a first lead having a first portion having a first thickness and a second portion having a second thickness that is greater than the first thickness, wherein the first portion of the lead supports the die and the second portion of the lead provides an IO connection on a side of the IC package; and a connection between the first lead portion and the die to provide an electrical path from the die to the IO connection. A flip-chip signal isolator IC package can further include the first lead etched to provide the first and second thicknesses. A flip-chip signal isolator IC package can further include the connections including a solder bump, solder ball, and/or pillar bump.

In another aspect, a method for providing a leadless signal isolator IC package comprises: employing a leadframe including a die paddle having opposing first and second surfaces, the first surface to support a die and the second surface being exposed on an exterior surface of the IC package; and employing a die supported by the die paddle, the die having a width, wherein a width of the second surface of the die paddle is less than the width of the die.

In another aspect, a method of providing a leadless signal isolator IC package comprises: employing a leadframe including a die paddle having opposing first and second sides, the first side comprising a first surface to support a die and the second side including second and third surfaces being exposed on an exterior surface of the IC package; and employing a die supported by the die paddle, the die having a width.

In another aspect, a method of providing a leadless signal isolator IC package comprises: employing a leadframe including a die paddle having opposing first and second sides, the first side comprising a first surface to support a die and the second side including a plurality of exposed surfaces on an exterior surface of the IC package; and employing a die supported by the die paddle, the die having a width.

In another aspect, a method of providing a leadless signal isolator IC package comprises: employing a leadframe having first and second die paddles each having opposed first and second surfaces; employing a first die supported by the first surface of the first die paddle; and employing a second die supported by the first surface of the second die paddle, wherein the second surface of the first die paddle is exposed on exterior surface of the package, and wherein the second surface of the second die paddle is exposed on the exterior surface of the package.

In another aspect, a method of providing a chip-on-lead leadless signal isolator IC package comprises: employing a die; employing a first lead having a first portion having a first thickness and a second portion having a second thickness that is greater than the first thickness, wherein the first portion of the lead supports the die and the second portion of the lead provides an IO connection for the IC package; and employing a wirebond connection from a pad on the die to the first lead.

In another aspect, a method of providing a flip-chip leadless signal isolator IC package comprises: employing a die; employing a first lead having a first portion having a first thickness and a second portion having a second thickness that is greater than the first thickness, wherein the first portion of the lead supports the die and the second portion of the lead provides an IO connection on a side of the IC package; and employing a connection between the first lead portion and the die to provide an electrical path from the die to the IO connection.

BRIEF DESCRIPTION OF THE DRAWINGS

The foregoing features of this invention, as well as the invention itself, may be more fully understood from the following description of the drawings in which.

DETAILED DESCRIPTION

Figure 1:
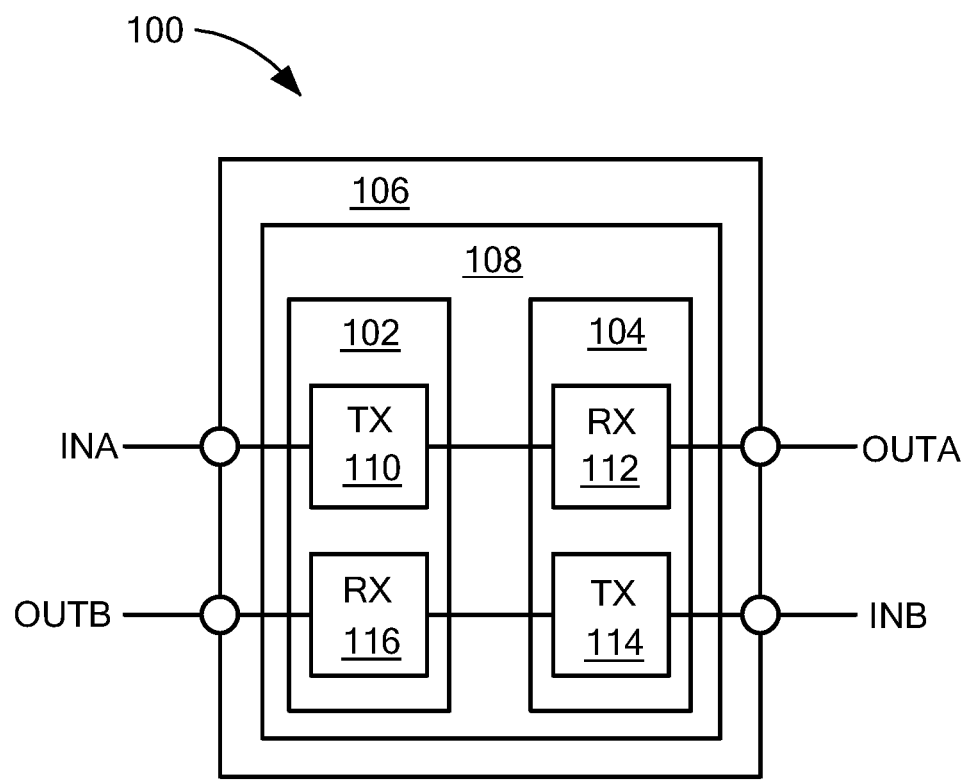
FIG. 1 is a schematic representation of a signal isolator having enhanced creepage characteristics in accordance with example embodiments of the invention.

FIG. 1 shows an example of a signal isolator 100 including first and second dies 102, 104 that form part of an integrated circuit package 106 having an exposed die paddle portion with enhanced creepage characteristics in accordance with example embodiments of the invention. In an embodiment, the IC package 106 includes a first input signal INA connected to the first die 102 and a first output signal OUTA connected to the second die 104. The IC package 106 further includes a second input signal INB connected to the second die 104 and a second output signal OUTB to the first die 104. The first and second dies 102, 104 are separated by a barrier region 108, such as an isolation barrier.

In embodiments, the first die 102 includes a first transmit module 110 and the second die includes a first receive module 112 that provides a signal path from the first input signal INA to the first output signal OUTA across the barrier 108. The second die 104 includes a second transmit module 114 and the first die 104 includes a second receive module 116 that provides a signal path from the second input signal INB to the second output signal OUTB across the barrier 108.

Embodiments can include any practical number of die including a single die having an isolation barrier. It is understood that any practical number of transmit, receive, and transmit/receive modules can be formed on the first and/or second die to meet the needs of a particular application. It is further understood that transmit, receive, and transmit/receive modules can comprise the same or different components. In addition, in embodiments, bi-directional communication is provided across the barrier. Further, circuity in the first and/or second die can be provided to process signals, perform routing of signals, and the like. In some embodiments, sensing (e.g., impedance, temperature, voltage, magnetic field, etc.) elements are formed in, on, or about the first and/or second die.

Figure 2A:
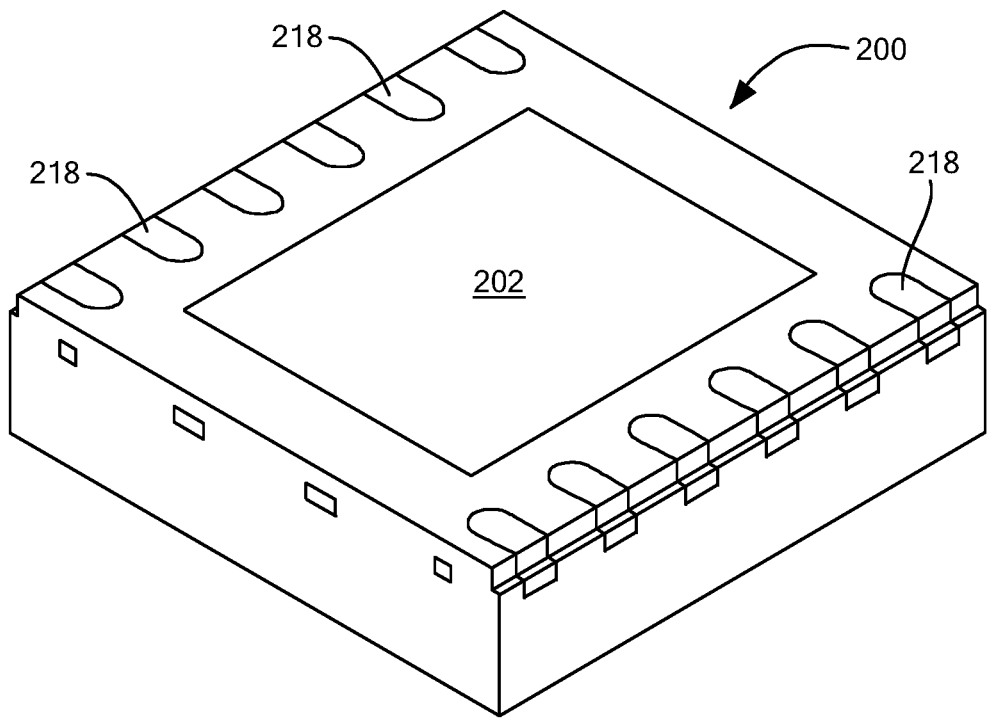
FIGS. 2A-2D show a conventional DFN package.
Figure 2B:
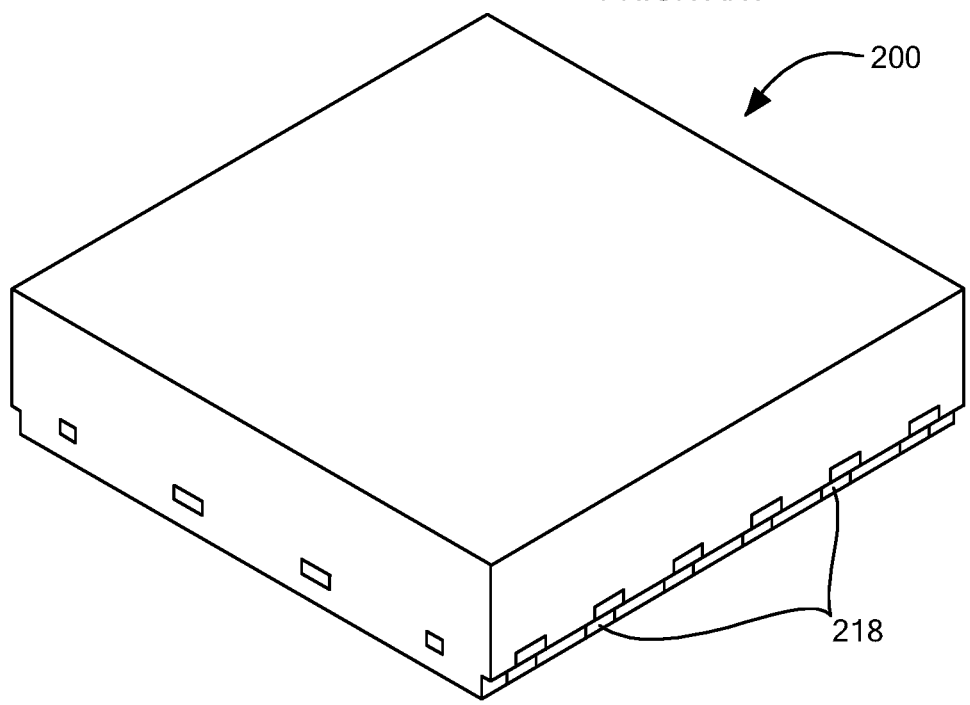
Figure 2C:
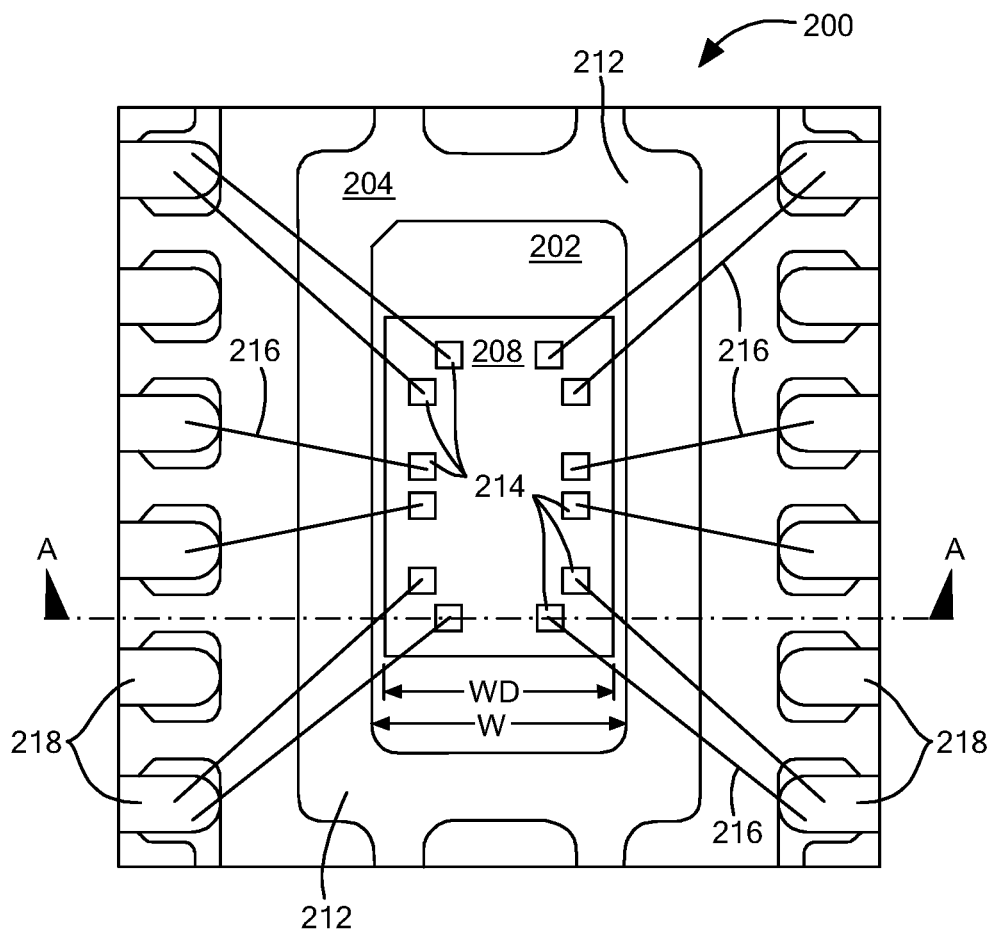
Figure 2D:
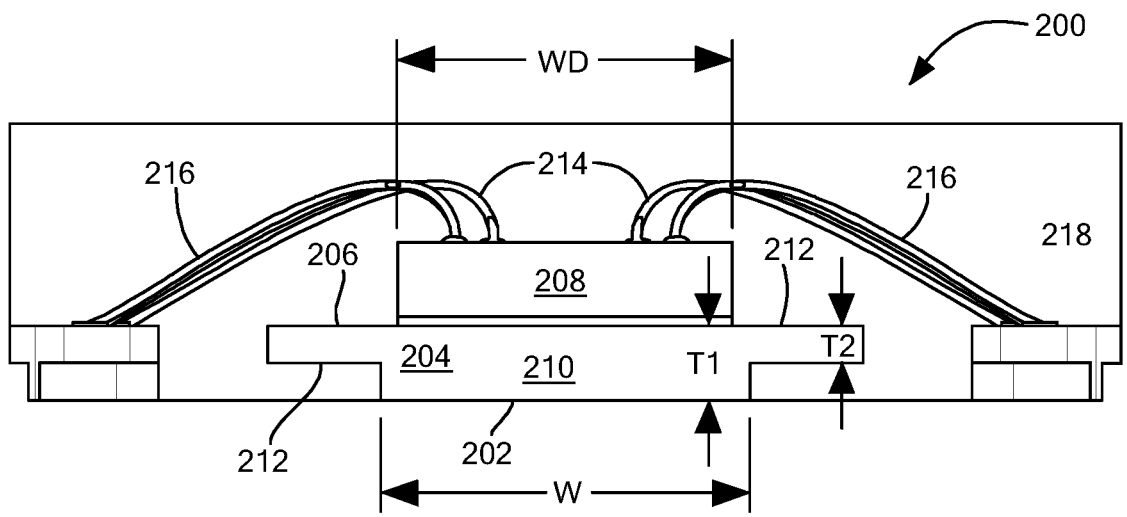

FIG. 2A shows a top perspective view of a prior art isolator IC package 200 having an exposed portion 202 of a die paddle, FIG. 2B shows a bottom perspective view of the prior art isolator IC package 200 of FIG. 2A, FIG. 2C shows a partially transparent top view of the prior art conventional IC package 200 of FIG. 2A, and FIG. 2D shows a cross-sectional view of prior art conventional IC package 200 of FIG. 2C along line A-A.

A die paddle 204 includes a first surface comprising the exposed portion 202 and a second surface 206 configured to support a die 208. The die paddle 204 is etched, for example, to have a middle portion 210 with a first thickness T1 and outer portions 212 having a second thickness T2. The width W of the exposed portion 202 of the die paddle is maximized for maximizing heat dissipation of energy generated by the die 208. The width W of the exposed portion 202 is greater than a width WD of the die 208. Conductive pads 214 can provide IO connections for the IC package 200. Wirebonds 216 can provide connections from conductive pads 214 on the die to the package IO 218.

With this configuration, the wide, shown as width W, exposed die paddle portion 202 decreases the creepage provided by the IC package. As will be readily appreciated by one skilled in the art, it is desirable to have as much creepage distance between the high and low voltage domains as possible. By having conductive material in the form of the exposed die paddle across a greater width of the IC package, electrical isolation between high and low voltage domains is decreased.

In contrast to conventional teachings for exposing die paddle material, it has been found by the inventors that increasing an amount of dielectric material across a width of an isolator IC package surface and decreasing an amount of exposed conductive material enhances the amount of creepage distance, enhancing electrical isolation between the high voltage and low voltage domains of the isolator.

Figure 3A:
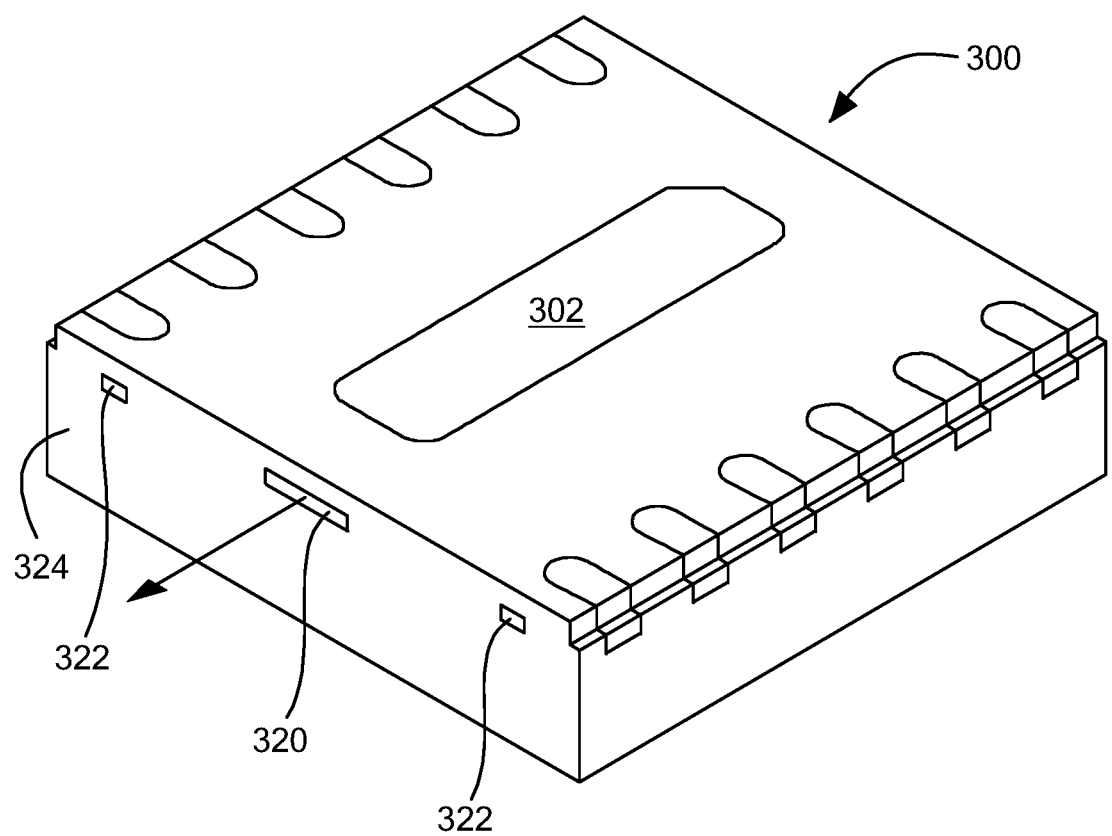
FIG. 3A is a perspective view of a signal isolator having an exposed die paddle portion with a reduced width.
Figure 3B:
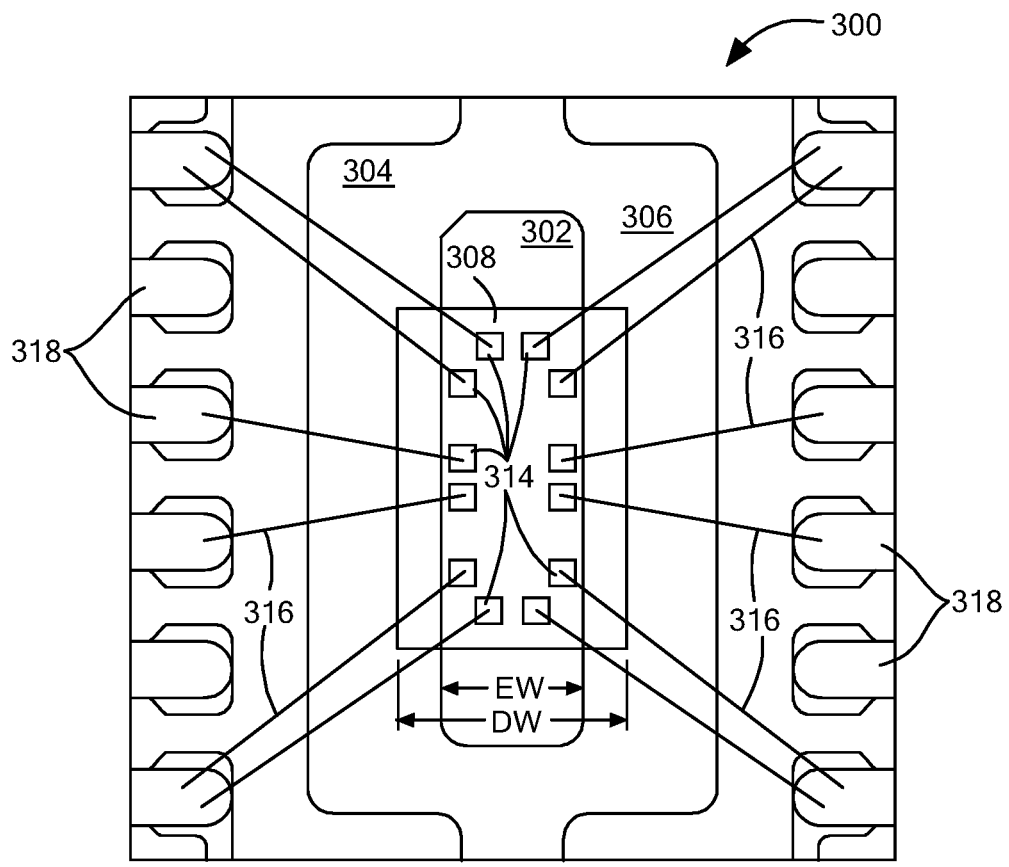
FIG. 3B is a partially transparent top view of the isolator of FIG. 3A.
Figure 3C:
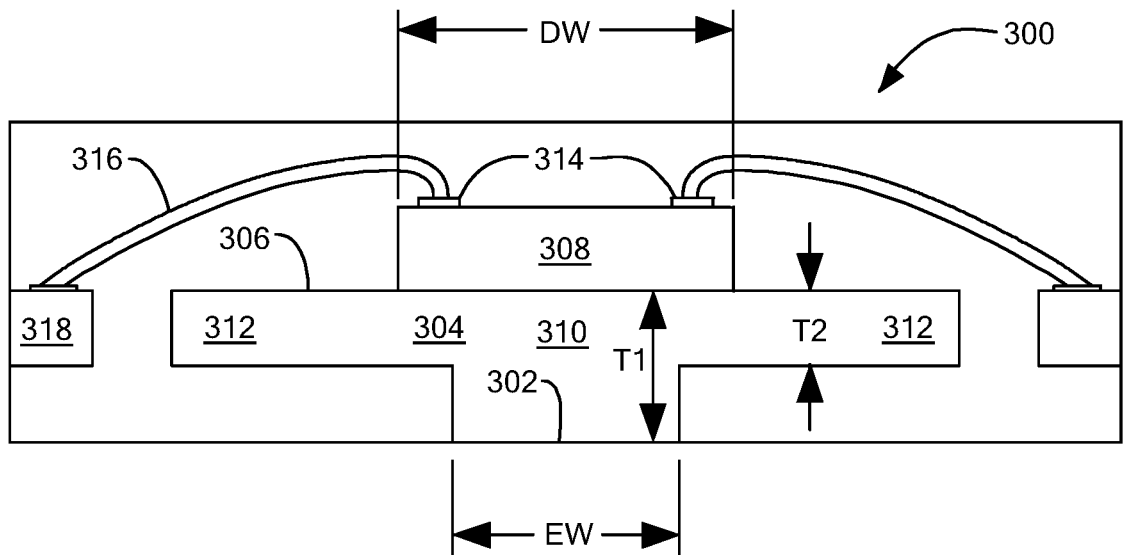
FIG. 3C is a cross-sectional view of the isolator of FIG. 3A.
Figure 3D:
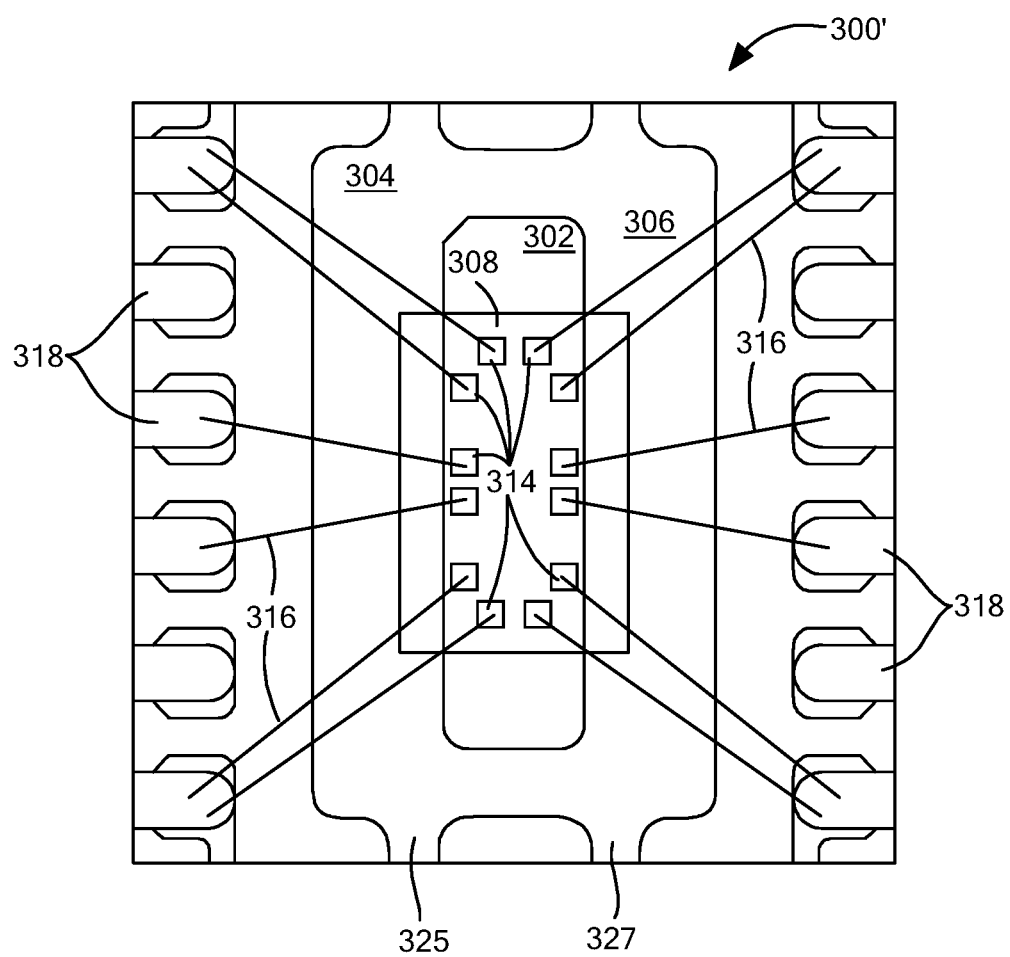
FIG. 3D is a partially transparent top view of another isolator embodiment.

FIG. 3A shows a bottom perspective view of an isolator IC package 300 having a portion 302 of exposed die paddle with a reduced width as compared with conventional IC packages, such as the prior art IC package 200 shown in FIG. 2A. FIG. 3B shows an example partially transparent top view of the isolator of FIG. 3A. FIG. 3C shows a cross-section of the isolator 300 of FIG. 3A. FIG. 3D shows an isolator IC package 300' having first and second tie bars 322 or 320.

The isolator 300 includes a die paddle 304 which has an exposed portion 302 which has a width EW that is less than a width DW of the die 308. A second surface 306 of the die paddle 304 is configured to support the die 308. The die paddle 304 can be etched or otherwise processed to have a middle portion 310 with a first thickness T1 and outer portions 312 having a second thickness T2.

The width EW of the exposed portion 302 of the die paddle 304 is reduced to enhance creepage distance of the IC 300 and increase the isolation voltage capability. Bond-pads 314, such as non-leads, can provide IO connections. Wirebonds 316 can provide connections from bond-pads 314 on the die to the package IO 318.

In the illustrated embodiment, the bond-pads 314 on the die 308 are inside the area defined by the exposed portion 302 of the die paddle 304. In the illustrated embodiment, an end 320 of the tie bar extending from die paddle 304 is exposed, as best shown in FIG. 3A. Ends 322 of the package IO 318 are also exposed on a side 324 of the IC package. A creepage distance extends from one edge of the tie bar end 320 to a closest edge of the IO end 322. As the width EW of the exposed portion 302 of die paddle is less than in conventional IC packages, the creepage distance is increased.

With this arrangement, the bond pads are located within an area corresponding to the exposed paddle so that the die can be stabilized during the wire bonding process.

Figure 3E:
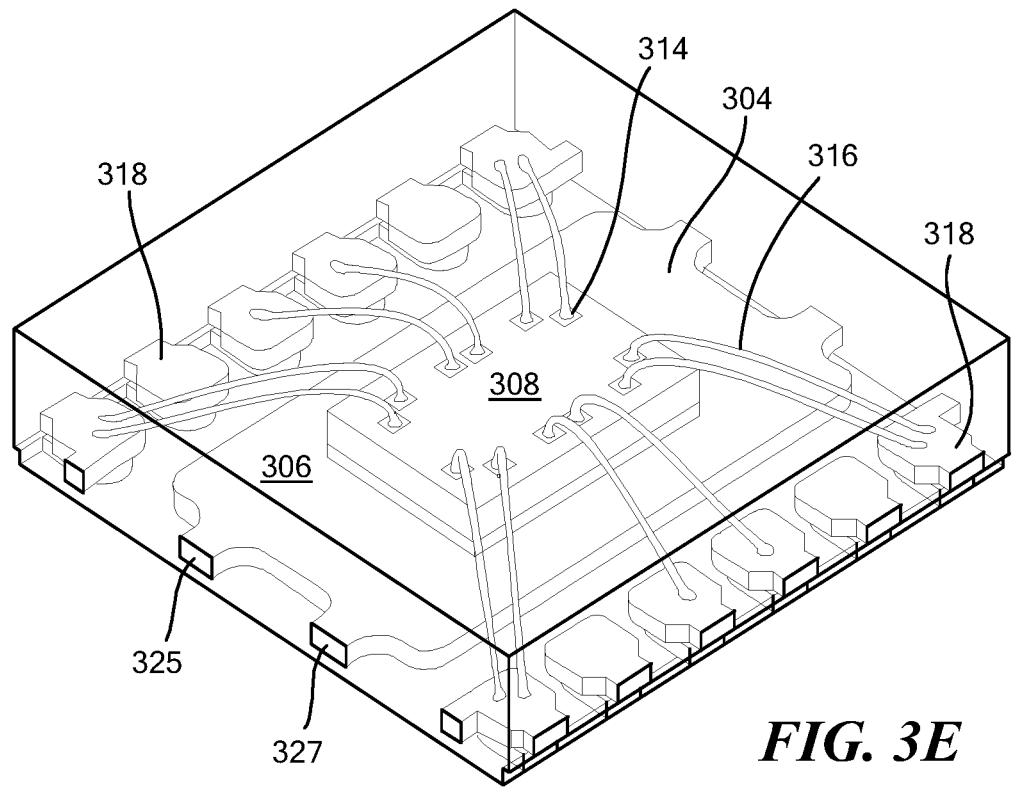
FIG. 3E is a semi-transparent perspective bottom view of the isolator of FIG. 3D.
Figure 3F:
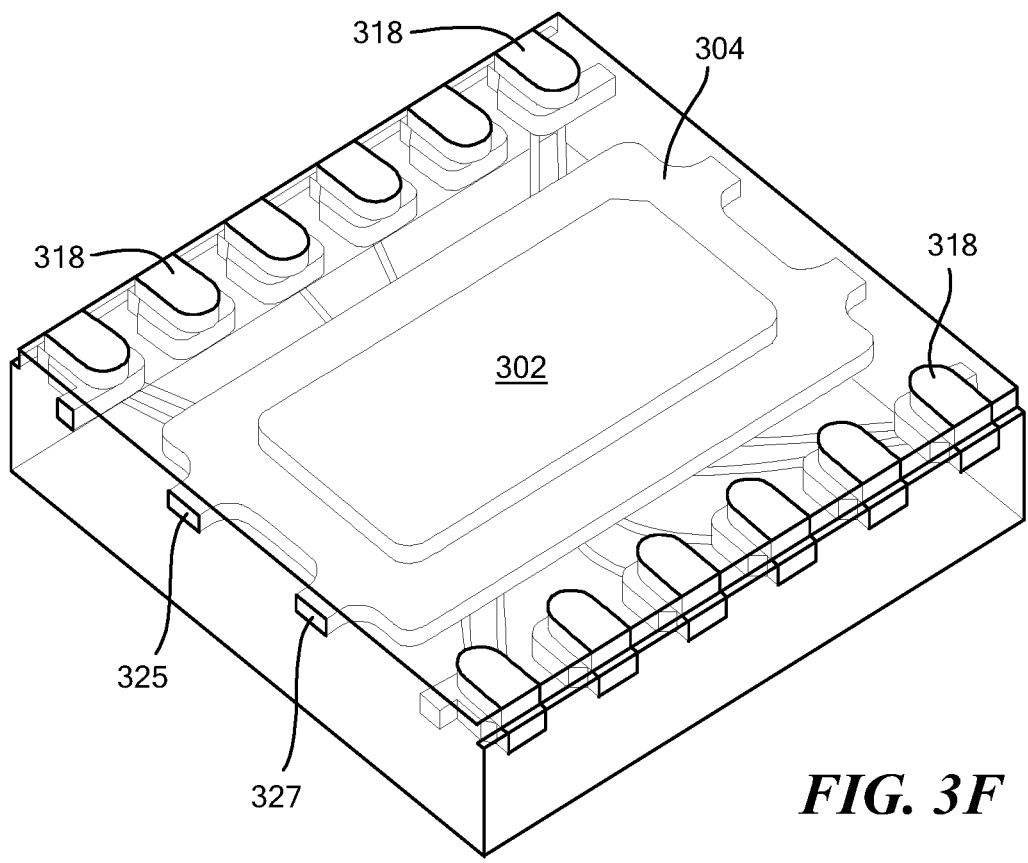
FIG. 3F is a semi-transparent perspective top view of the isolator of FIG. 3D.

FIGS. 3D-3F show an IC package similar to that shown in FIGS. 3A and 3B with first second tie bars 325, 327 instead of one tie bar as shown in FIG. 3A. Two tie bars add more stability during the assembly process of wirebonding and overmolding. The two tiebar configuration can reduce the amount of exposed metal on the side of the package increasing the creepage distance. It is understood that creepage distance can refer to the cumulative distance of the nonconductive exposed material from one side of the isolation barrier to the other. With regard to creepage distance, the greater the distance, the higher the voltage rating of the insulator of the package.

Figure 3G:
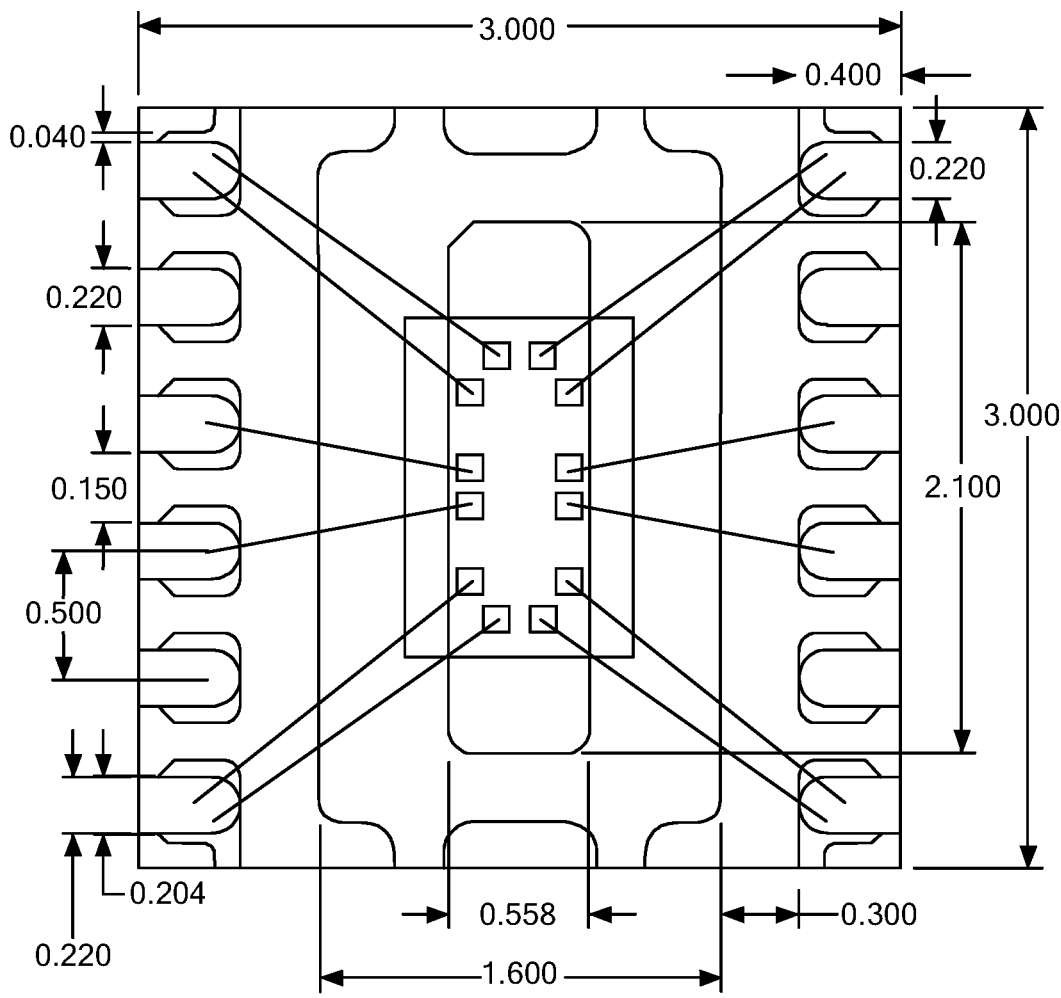
FIG. 3G shows the isolator of FIG. 3D with example dimensions.

FIG. 3G shows the isolator of FIG. 3D with example dimensions. Creepage distance on the bottom is from the pins on one side to the paddle plus the distance from the paddle to the pins on the other side, and similarly along the side of the package with the exposed tiebars.

It is understood that the illustrated dimensions are merely an example and that dimensions of the various components can vary to meet the needs of a particular application.

Figure 3H:
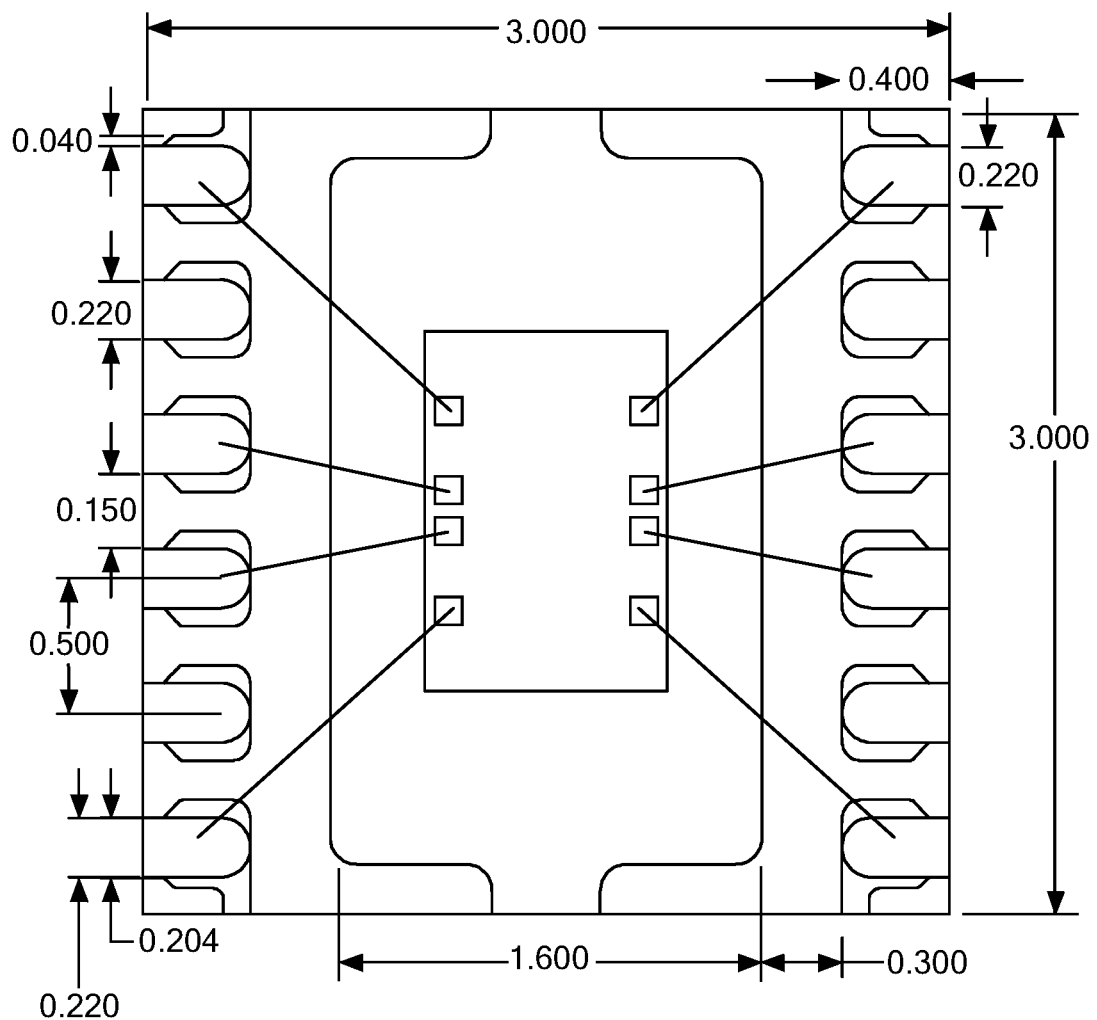
FIG. 3H is a semi-transparent top view of another isolator embodiment without exposed die paddle.

FIG. 3H is a semi-transparent top view of another isolator embodiment without exposed die paddle.

It is understood that a leadframe can include a die paddle to support a die on one side and on the other side be exposed on an external surface of the IC package to provide heat dissipation, as well as to stabilize the die during a wire-bonding process, for example.

As can be seen with regard to FIGS. 2A through 3F, some embodiments include a wettable flank QFN/DFN configuration having a step cut plating in the leads and do not have step cut plating. For example, FIGS. 2A-2D include a wettable flank DFN configuration configured for automotive applications.

Figure 4:
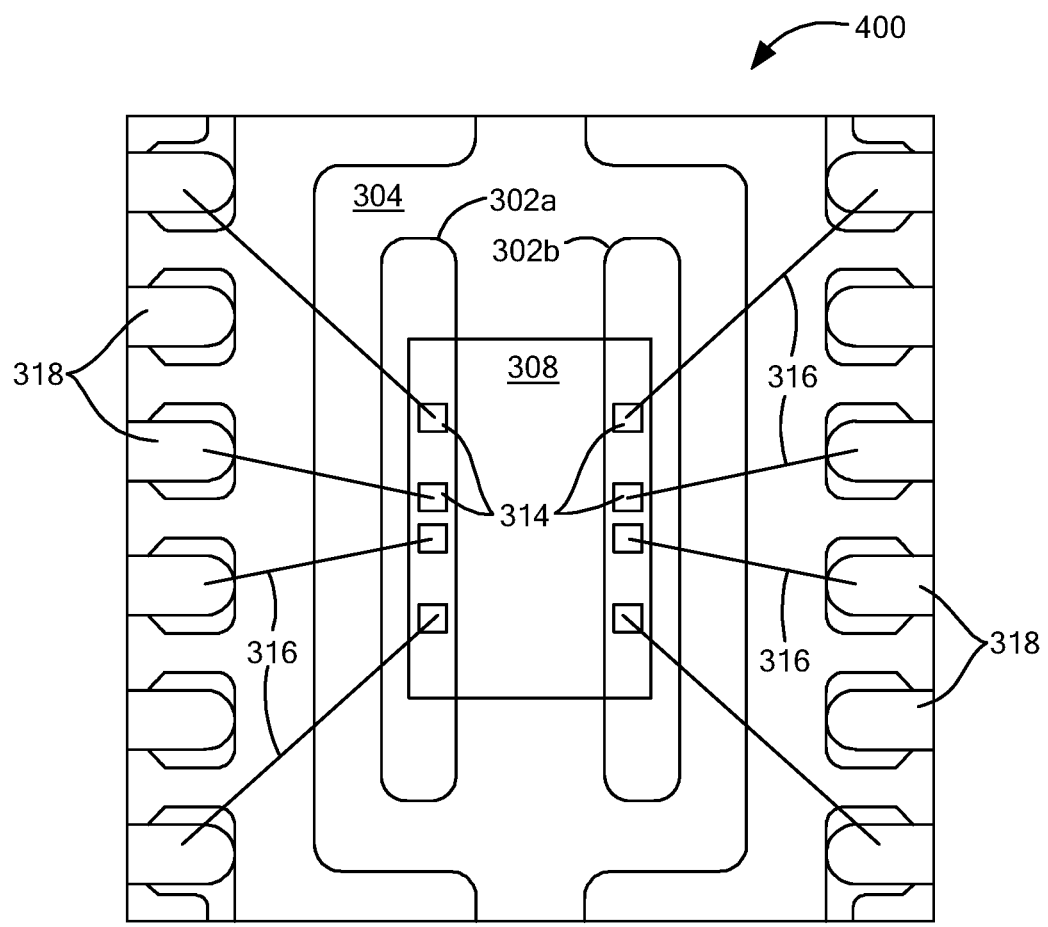
FIG. 4 is a partially transparent top view of another isolator embodiment.

FIG. 4 shows an isolator IC package 400 having first and second exposed portions 302a,b of a die paddle 304. Conductive pads 314 on the die are aligned along edges of the die 308. As shown in the illustrated embodiment, the first exposed portion 302a of the die paddle 304 is aligned with conductive pads 314 on a 'left' side of the die 304 and the second exposed portion 302b is aligned with conductive pads on a 'right' side of the die.

In example embodiments, the first and second exposed portions 302a,b of the die paddle 304 are generally rectangular to reduce a total width of the conductive material exposed on an external surface of the IC package, as well as to align with the conductive pads 314 on the edges of the die 308. The advantage of the first and second exposed paddles will depend on the distance that the bond pads need to be on the die and if one or two paddles is needed to maximize the creepage distance.

Figure 5:
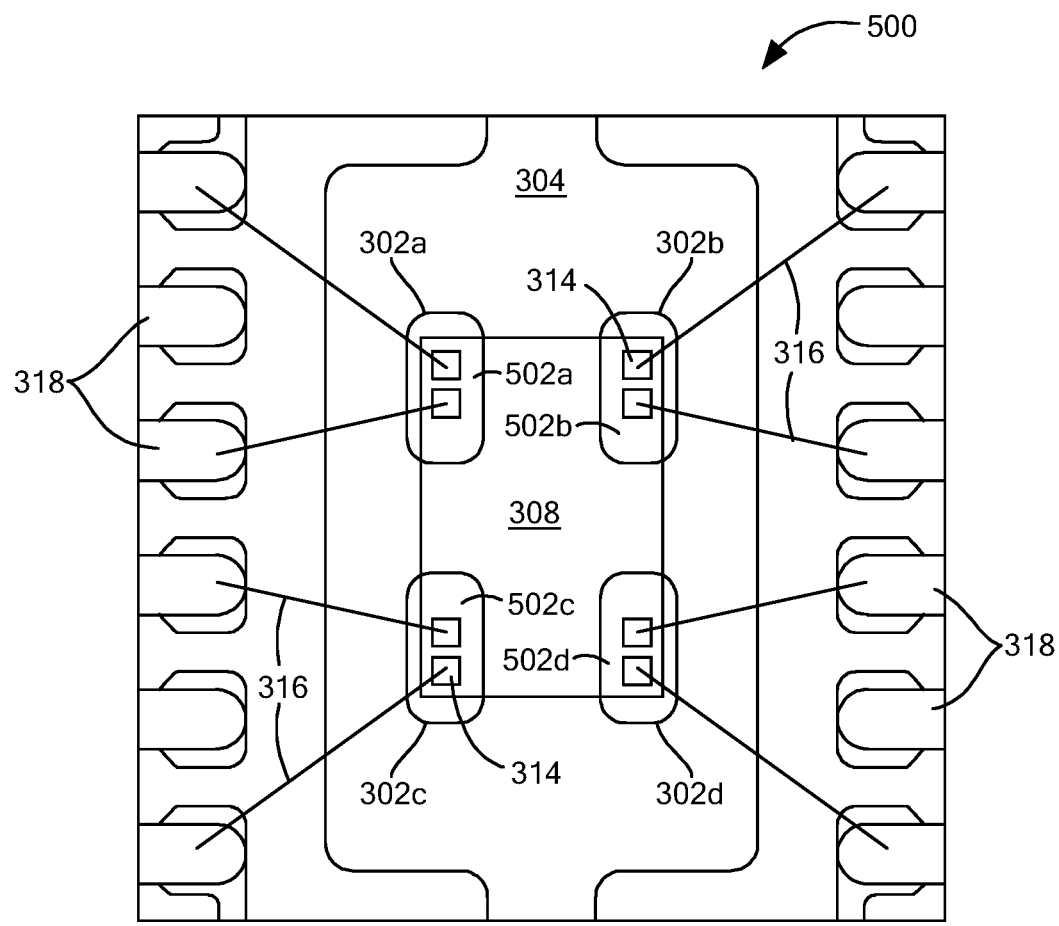
FIG. 5 is a partially transparent top view of another isolator embodiment.

FIG. 5 shows an isolator IC package 500 having first, second, third and fourth exposed portions 302a,b,c,d of a die paddle 304. Conductive pads 314 on the die are grouped into first, second, third, and fourth locations 502a,b,c,d generally in corners of the die 308. As shown in the illustrated embodiment, the first exposed portion 302a of the die paddle 304 is aligned with conductive pads 314 in the first location 502a, the second exposed portion 302b of the die paddle 304 is aligned with conductive pads 314 in the second location 502b, the third exposed portion 302c of the die paddle 304 is aligned with conductive pads 314 in the third location 502c, and the fourth exposed portion 302d of the die paddle 304 is aligned with conductive pads 314 in the fourth location 502d.

As can be seen, the amount of paddle that is exposed on the external surface of the IC package is reduced. Similar to FIG. 4 the requirement of a particular application may determine which option is more advantageous.

It is understood that any practical number of locations with corresponding exposed die portions can be used to meet the needs of a particular application. In addition, the shape of the exposed die paddle portions can be any geometry that is useful to maximize creepage distance. Further, the location of the conductive die pads can be selected to meet the needs of a particular application.

Figure 6:
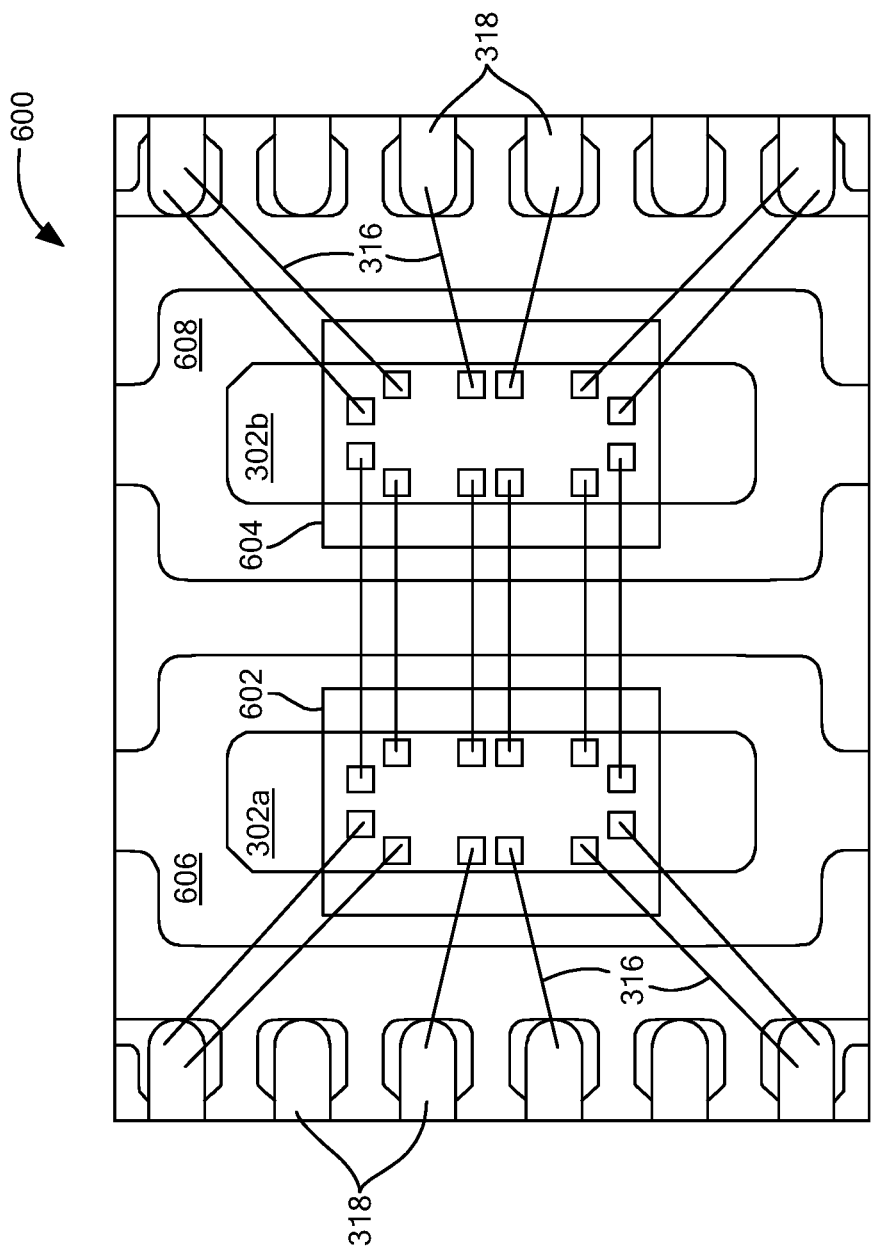
FIG. 6 is a partially transparent top view of another isolator embodiment.

FIG. 6 shows an example signal isolator 600 having first and second die 602, 604. In embodiments, separate die can be provided. In other embodiments, a single die can be separated into first and second electrically isolated die portions 602, 604. In the illustrated embodiment, a first exposed portion 302a of a first die paddle 606 is aligned with the first die 602 and a second exposed portion of a second die paddle 608 is aligned with the second die 604. The multi-die configuration maximizes the internal clearance through the mold compound between sides of the isolation barrier to maximize the voltage that the internal package can withstand without breakdown.

Figure 7:
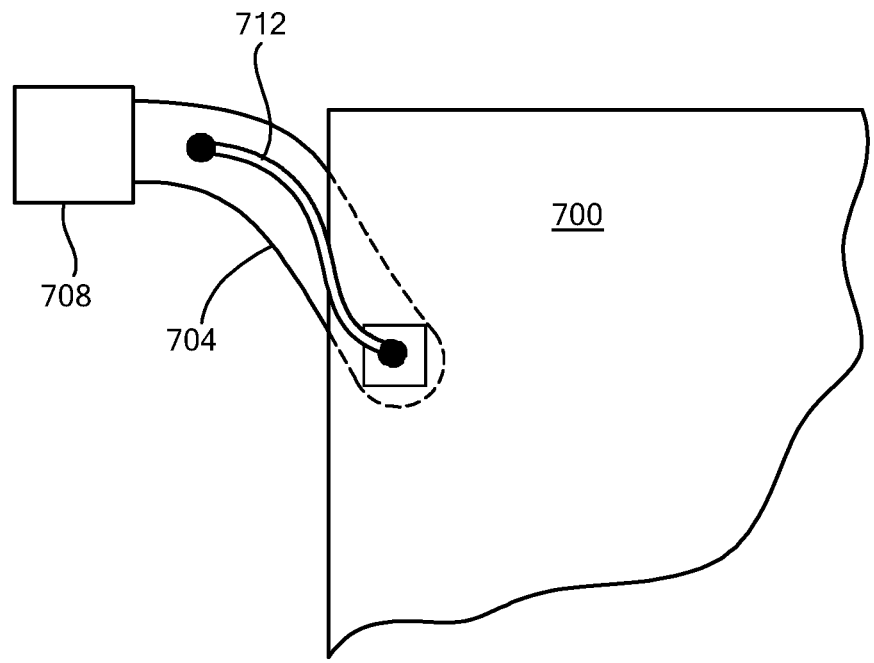
FIG. 7 is a top view and FIG. 8 is a side view of a chip-on-lead isolator IC embodiment.
Figure 8:
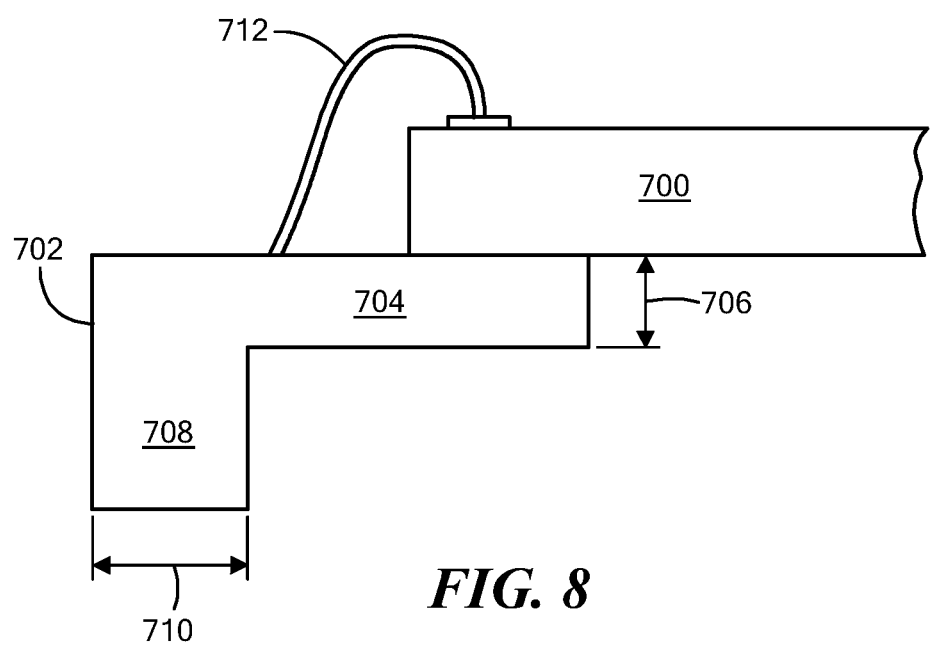

FIG. 7 is a top view and FIG. 8 is a side view of a portion of a chip-on-lead isolator IC package embodiment. In some embodiments, the illustrated IC package can be considered a chip-on-lead version of the IC package shown in FIGS. 3E and 3F. A die 700 is supported at an edge, for example, by a lead 702. In embodiments, the lead 702 has a first portion 704 having a first thickness 706 and a second portion 708 having a second thickness 710, where the first thickness is less than the second thickness. In some embodiments, the first portion 704 is about half the thickness of the second portion. The first portion 704 of the lead 702 can be referred to as half-etched. In embodiments, the half-etched lead portion 704 is molded prior to placement of the die 700 and formation of the wirebonds 712 from die to lead. An epoxy die attach may be used to connect die 700 to the lead 702 or in other embodiments to the prior molded material. In some embodiments the epoxy die attach may be a non-conductive epoxy, for example but not limited to case where the epoxy connects the die to the lead(s) or the die to the lead(s) and pre-molded or prior molded material.

Embodiments can provide an isolator in QFN, DFN package, and the like. In some embodiments, the QFN/DFN package can include half-etching to enhance creepage distance, as described above.

Figure 9:
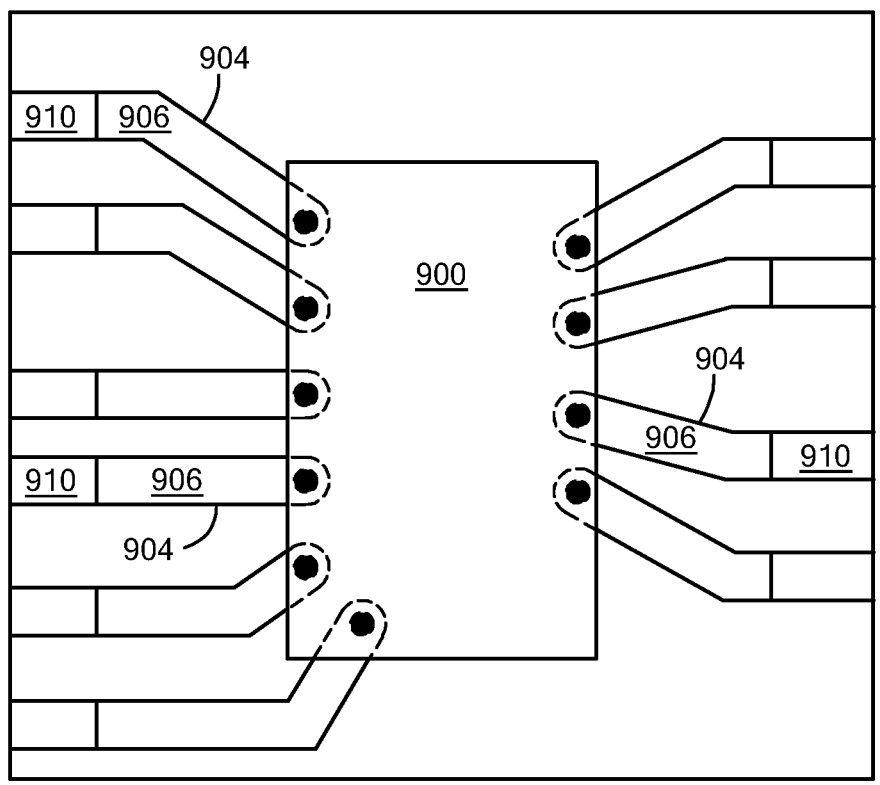
FIG. 9 is a top view and FIG. 10 is a partially transparent perspective view of a flip-chip isolator IC embodiment.
Figure 10:
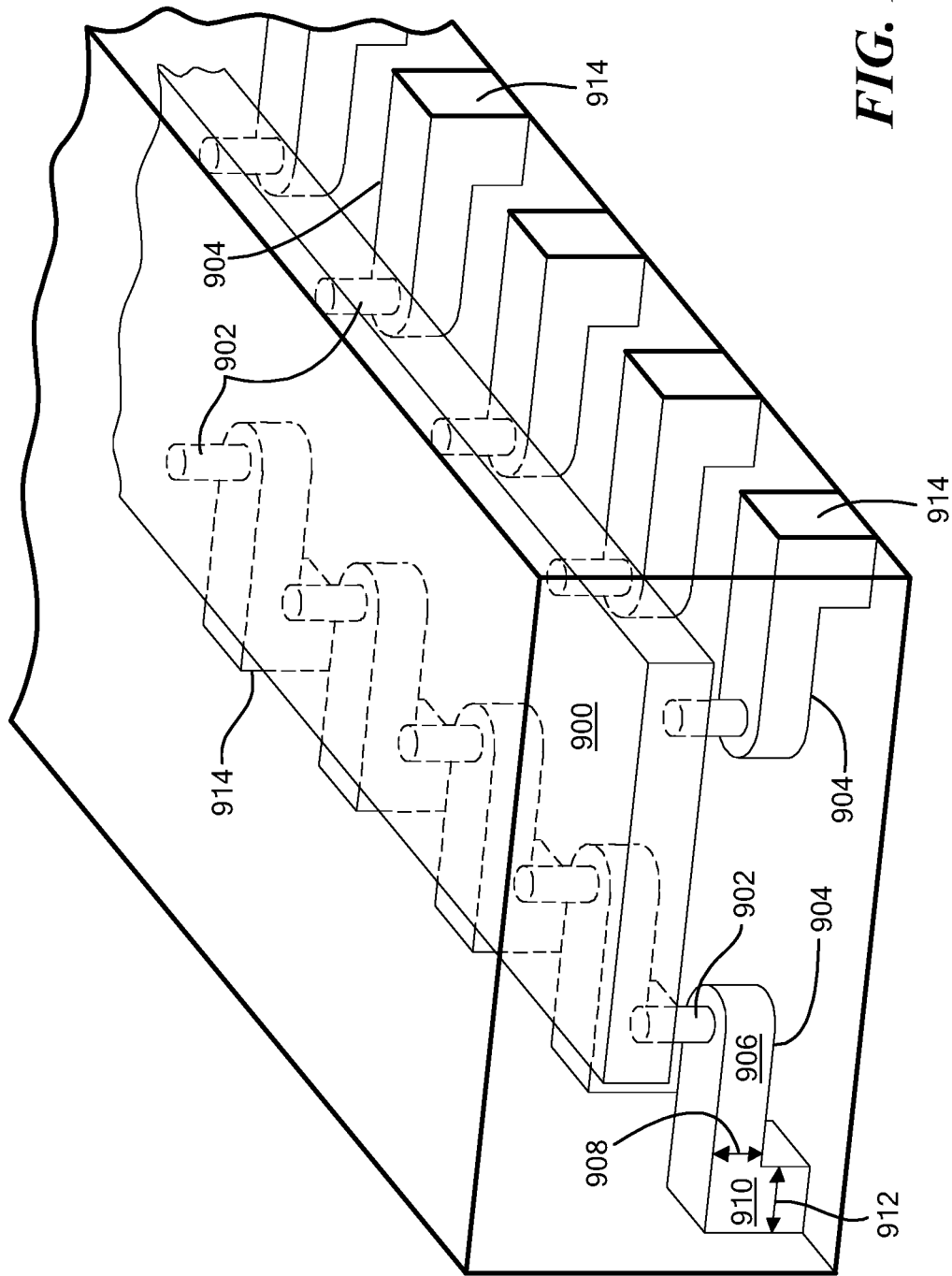

FIG. 9 is a top view and FIG. 10 is a partially transparent view of a flip-chip isolator IC package embodiment with some features common to the isolator of FIGS. 3E and 3F. A die 900 is supported by solder bumps/pillars 902 resting on leads 904 exposed on a side of the package. Solder bumps/pillars 902 can comprise solder balls, including other conductive materials, which can be reflowed, pillar bumps, conductive epoxy, and/or other materials capable of making suitable electrical connections. Solder bumps, solder balls or pillars, or stud bumps, can be used where the solder may include a standard solder or other reflowable electrical and mechanical connecting material, including but not limited to, tin lead solder, including but not limited to high lead Sn5Pb95, and Sn63Pb37, and lead free solders, including, but not limited to, Tin (Sn) and Sn alloys, for example Sn/Ag/Cu alloys, BiSn alloys, and BiSnAg alloys, and Indium and indium alloys. The pillars may include but are not limited to copper pillars. The stud bumps may comprise, for example, a gold stud bump. In some embodiments, there may be a silver (Ag) pad on the lead(s) for wirebond or other electrical connection.

In embodiments, mold compound, which can encapsulate assembly, is used as mechanical encapsulation as well as part of the insulation system In embodiments, the lead 904 has a first portion 906 having a first thickness 908 and a second portion 910 having a second thickness 912, where the first thickness is less than the second thickness. In some embodiments, the first portion 906 is about half the thickness of the second portion. The first portion 906 of the lead 904 can be referred to as half-etched. In embodiments, the half-etched lead portion 906 is molded prior to placement of the die 900.

In embodiments, an edge 914 of the leads 904 are exposed to provide external connections to the IC package. This arrangement provides better creepage and clearance on the outside of the package and is capable of lower total package thickness when compared to a wire-bond with a loop height.

Having described exemplary embodiments of the invention, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A leadless signal isolator IC package, comprising:
   a leadframe having first and second die paddles each having opposed first and second surfaces;
   a first die supported by the first surface of the first die paddle; and
   a second die supported by the first surface of the second die paddle,
   wherein the second surface of the first die paddle is exposed on exterior surface of the package, and wherein the second surface of the second die paddle is exposed on the exterior surface of the package,
   wherein the IC package is rectangular having first, second, third and fourth sides, wherein the first and third sides are parallel to each other,
   wherein the leadframe includes at least one tie bar exposed on the first side of the IC package,
   wherein the second side of the IC package includes a series of package IO terminals such that at least one tie bar and the series of package IO terminals are located on adjacent sides of the IC package, and
   wherein a first creepage distance comprises an edge of the at least one tie bar to an edge of a first one of the IO terminals of the IC package.

2. The leadless signal isolator IC package according to claim 1, wherein the second surface of the first die paddle is aligned with the first die.

3. The leadless signal isolator IC package according to claim 2, wherein a width of the second surface of the first die paddle is less than a width of the first die.

4. The leadless signal isolator IC package according to claim 3, wherein the second surface of the second die paddle is aligned with the second die.

5. The leadless signal isolator IC package according to claim 4, wherein a width of the second surface of the second die paddle is less than a width of the second die.

6. The leadless signal isolator IC package according to claim 5, wherein the first and second die are formed from a single die.

7. The leadless signal isolator IC package according to claim 5, wherein the first and second die are electrically isolated from each other.

8. A method of providing a leadless signal isolator IC package, comprising:
  employing a leadframe having first and second die paddles each having opposed first and second surfaces;
  employing a first die supported by the first surface of the first die paddle; and
  employing a second die supported by the first surface of the second die paddle,
  wherein the second surface of the first die paddle is exposed on exterior surface of the package, and wherein the second surface of the second die paddle is exposed on the exterior surface of the package,
  wherein the IC package is rectangular having first, second, third and fourth sides, wherein the first and third sides are parallel to each other,
  wherein the leadframe includes at least one tie bar exposed on the first side of the IC package,
  wherein the second side of the IC package includes a series of package IO terminals such that at least one tie bar and the series of package IO terminals are located on adjacent sides of the IC package, and
  wherein a first creepage distance comprises an edge of the at least one tie bar to an edge of a first one of the IO terminals of the IC package.

9. The method according to claim 8, wherein the second surface of the first die paddle is aligned with the first die.

10. The method according to claim 9, wherein a width of the second surface of the first die paddle is less than a width of the first die.

11. The method according to claim 10, wherein the second surface of the second die paddle is aligned with the second die.

12. The method according to claim 11, wherein a width of the second surface of the second die paddle is less than a width of the second die.

13. The method according to claim 12, wherein the first and second die are formed from a single die.

14. The method package according to claim 13, wherein the first and second die are electrically isolated from each other.

* * * * *